(12) United States Patent
Bonke

(10) Patent No.: US 9,984,771 B2
(45) Date of Patent: May 29, 2018

(54) MULTI-LEVEL RAID-TYPE ENCODING WITH RANDOM CORRECTION CAPABILITY

(71) Applicant: SANDISK TECHNOLOGIES LLC, Plano, TX (US)

(72) Inventor: Carl Edward Bonke, Coto De Caza, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days. days.

(21) Appl. No.: 15/274,109

(22) Filed: Sep. 23, 2016

(65) Prior Publication Data

US 2017/0201273 A1    Jul. 13, 2017

Related U.S. Application Data

(60) Provisional application No. 62/277,168, filed on Jan. 11, 2016.

(51) Int. Cl.
*H03M 13/00* (2006.01)
*G11C 29/52* (2006.01)
*G06F 11/10* (2006.01)
*H03M 13/29* (2006.01)
*H03M 13/11* (2006.01)
*H03M 13/15* (2006.01)

(52) U.S. Cl.
CPC .......... *G11C 29/52* (2013.01); *G06F 11/1068* (2013.01); *H03M 13/293* (2013.01); *H03M 13/2909* (2013.01); *H03M 13/1102* (2013.01); *H03M 13/152* (2013.01); *H03M 13/1515* (2013.01)

(58) Field of Classification Search
None
See application file for complete search history.

(56) References Cited

U.S. PATENT DOCUMENTS

| 5,751,733 | A | 5/1998 | Glover |
| 5,844,919 | A | 12/1998 | Glover et al. |
| 7,823,043 | B2 * | 10/2010 | Lasser ................... H03M 13/03 714/752 |
| 8,375,274 | B1 | 2/2013 | Bonke |
| 8,484,533 | B2 | 7/2013 | Olbrich et al. |
| 8,788,910 | B1 | 7/2014 | Northcott |
| 8,924,815 | B2 * | 12/2014 | Frayer ................. G06F 11/1012 714/755 |
| 9,110,822 | B2 * | 8/2015 | Chandrasekhar ... G06F 11/1072 |
| 9,459,955 | B2 * | 10/2016 | Tuers ................. G06F 11/1012 |
| 9,761,273 | B1 * | 9/2017 | Chen .................. G11B 20/1833 |
| 2004/0088636 | A1 * | 5/2004 | Cypher ............... G06F 11/1048 714/764 |

(Continued)

*Primary Examiner* — Daniel McMahon
(74) *Attorney, Agent, or Firm* — Toler Law Group, PC

(57) ABSTRACT

A data storage device is configured to encode first data according to a first error correction coding (ECC) scheme to generate a first codeword and to encode second data according to the first ECC scheme to generate a second codeword. The data storage device is configured to generate first parity data by encoding at least a first portion of the first codeword and a first portion of the second codeword using a composite generator function. The data storage device is configured to store the first codeword, the second codeword, and the first parity data in a memory.

23 Claims, 8 Drawing Sheets

(56) References Cited

U.S. PATENT DOCUMENTS

| | | |
|---|---|---|
| 2007/0214316 A1 | 9/2007 | Kim |
| 2013/0042053 A1 | 2/2013 | Huang |
| 2013/0166988 A1* | 6/2013 | Sharon ................ G06F 11/1012 714/758 |
| 2013/0254623 A1* | 9/2013 | Yang .................. G11B 20/1833 714/763 |
| 2015/0046767 A1 | 2/2015 | Cideciyan et al. |
| 2015/0143027 A1 | 5/2015 | Luo et al. |
| 2015/0205668 A1 | 7/2015 | Sundaram et al. |
| 2015/0229333 A1* | 8/2015 | Alekseev ............ H03M 13/616 714/752 |
| 2015/0303943 A1* | 10/2015 | Li ...................... H03M 13/1105 714/758 |
| 2015/0324251 A1* | 11/2015 | D'Abreu ............. G06F 11/1044 714/773 |
| 2016/0357632 A1* | 12/2016 | d'Abreu ............. G06F 11/1072 |

\* cited by examiner

MULTI-LEVEL RAID-TYPE ENCODING WITH RANDOM CORRECTION CAPABILITY

CROSS-REFERENCE TO RELATED APPLICATIONS

The present application claims benefit of U.S. Provisional Application No. 62/277,168, filed Jan. 11, 2016, which is incorporated by reference herein in its entirety.

FIELD OF THE DISCLOSURE

This disclosure is generally related to data storage devices and more particularly to data encoding and recovery using error correction coding (ECC) techniques.

BACKGROUND

Non-volatile data storage devices, such as flash solid state drive (SSD) memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per cell, 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g., "parity bits") that may be stored with the data as an ECC codeword. As more parity bits are used, an error correction capacity of the ECC increases and a number of bits required to store the encoded data also increases. Using a sufficient number of parity bits to provide "worst-case" error correction capability for all data stored in a memory device reduces the storage density of the memory device in order to protect against an amount of data corruption that is statistically unlikely to occur before the memory device reaches the end of its useful life.

SSD devices may incorporate a redundant array of independent disks (RAID)-type storage scheme that may use parity bits to enable data recovery in case of device failures. For example, a RAID 6 storage scheme may distribute data, a first parity for the data, and a second parity for the data in a "stripe" across multiple non-volatile memories (e.g., across multiple SSDs or across multiple NAND flash memories in a single SSD). The first parity (or the second parity) may enable recovery of the data in the stripe in case of erasures due to failure of one of the data-storing non-volatile memories, and the first parity and the second parity together may enable recovery of the data in the stripe in case of erasures due to failure of two of the data-storing non-volatile memories. However, data in such storage schemes may not be recoverable if three or more of the data-storing non-volatile memories fail.

DETAILED DESCRIPTION

Figure 1:
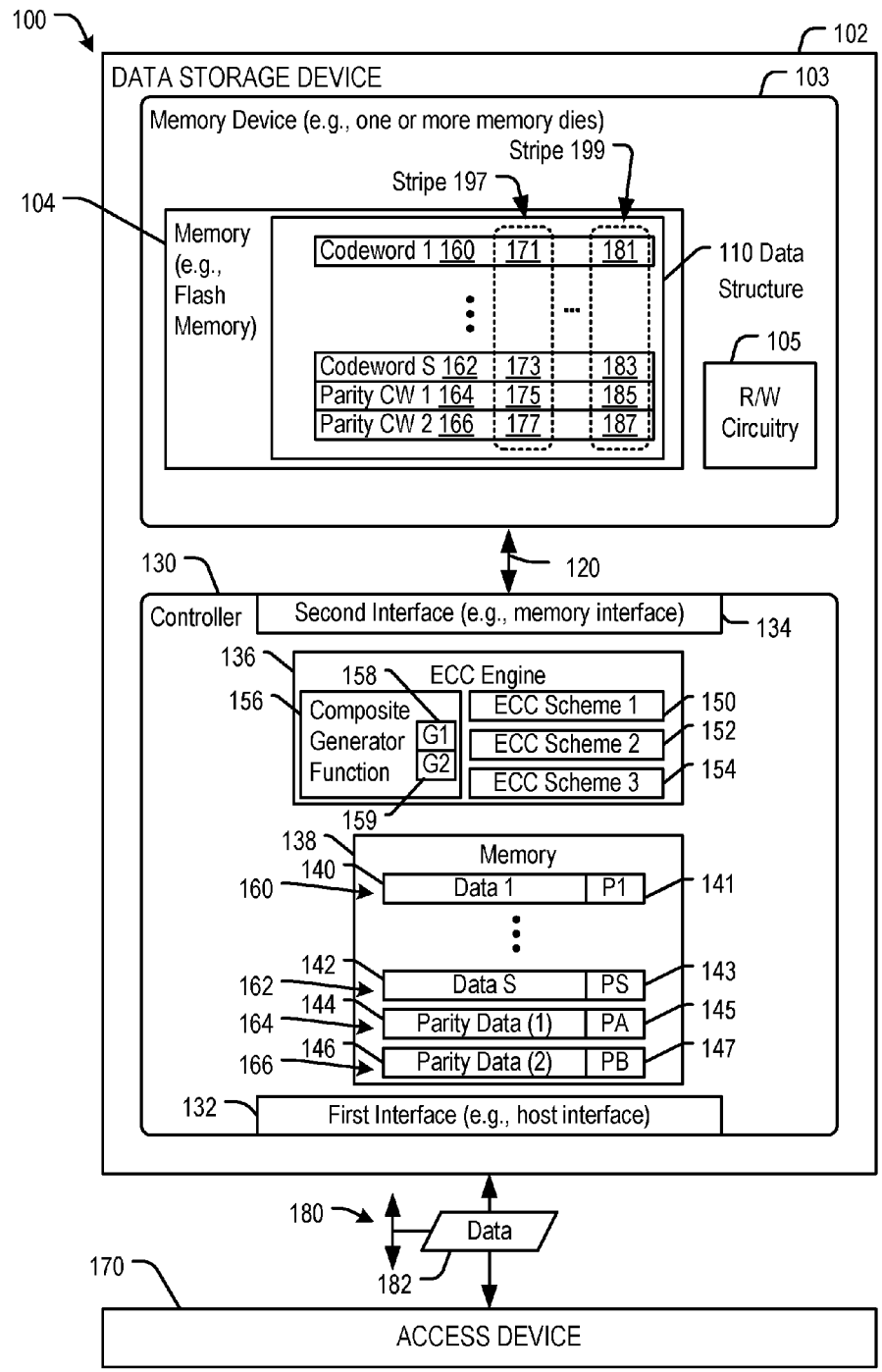
FIG. 1 is a block diagram of an illustrative example of a system including a data storage device including an ECC engine configured to encode data using a composite generator function.

A data storage device is configured to encode data to form multiple codewords that are independently decodable using a first ECC scheme ("correction scheme"), such as an algebraic code (e.g., Reed Solomon or Bose-Chaudhuri-Hocquenghem (BCH)) or a statistical correction scheme (e.g., low-density parity check (LDPC)). The data storage device is further configured to encode one or more "stripes" of the data (e.g., one or more data words formed by combining portions of multiple codewords) using a composite generator function to generate stripe parity. As an example, a stripe may include portions of data distributed across multiple packages of one or more NAND flash dies (or other non-volatile memory dies), across multiple dies, across portions of pages within a single die, or any combination thereof.

The composite generator function is formed from a combination of multiple generator functions. To illustrate, the composite generator function may be Reed Solomon or BCH, as illustrative, non-limiting examples. For example, in a BCH code, each of the multiple generator functions may add one bit of error correction to the composite function, and in a Reed Solomon code, each two generator functions may add one symbol of correction to the composite function. The generator functions may be Galois polynomials that are multiplied together to form the composite function. Encoding the stripes using the composite generator function generates stripe parity that provides sufficient redundancy to enable decoding of erasures in each stripe according to a second correction scheme. If a number of errors in a stripe exceeds an erasure correction capability of the second correction scheme, stripe error decoding may be performed according to a third correction scheme. Each stripe that is decoded results in correction of the data in the stripe and therefore correction of a portion of each of the codewords that "participate" in the stripe. As used herein, a codeword "participates in" or "corresponds to" a stripe if the stripe includes data (e.g., one or more data bits and/or parity bits) that is in the codeword (i.e., the stripe includes a portion of the codeword).

The data storage device may use stripe encoding to provide enhanced correction capability in case a codeword is undecodable due to too many errors occurring in the codeword. Upon detecting that a codeword is undecodable according to the first correction scheme, the data storage device may attempt decoding of one or more stripes that include portions of the codeword. When one or more codewords that participates in a stripe are undecodable using the first correction scheme, the second correction scheme may use an erasure correction procedure for the stripe to correct erasures in the stripe due to the undecodable codeword(s). For example, depending on the number of uncorrectable codewords, a first set of parity bits (a "partial syndrome") or a second set of parity bits (a "composite syndrome") may be generated for decoding a stripe codeword (e.g., by running stripe data and stripe parity read from the memory through the composite generator or through each parity factor separately). Partial syndromes may be generated by dividing the data polynomial by each generator "factor" polynomial. A composite syndrome may be computed by dividing the data polynomial by the composite generator polynomial. "Multilevel" stripe decoding to correct multiple undecodable codewords may therefore be performed using the second correction scheme with a decoding process that generates multiple partial syndromes for correcting multiple erasures due to multiple undecodable codewords.

Because the composite generator function is used to generate the stripe parity, if a number of undecodable codewords that participate in the stripe exceeds an erasure correction capability of the second correction scheme, the stripe parity that is generated during the decoding process may be used according to a third correction scheme to perform "random" correction of errors (e.g., correction of non-erasure errors whose locations are unknown) that may be in the stripe data and/or in the stripe parity that was read from the memory. For example, although multiple codewords that participate in the stripe may each be undecodable using the first correction scheme, the portions of the undecodable codewords that are in the stripe may have relatively few errors (or may be error-free). Thus, the number of errors in the stripe may be smaller than the random error correction capability provided by the stripe parity, enabling correction of errors in the portions of the undecodable codewords that are within the stripe using the partial syndromes. In some implementations, random error correction is implemented in the third correction scheme using partial syndromes calculated during readback. (Under certain circumstances the composite syndrome may be used for burst correction, such as in a "heroics" mode of operation after exhausting an iterative decoding process that, as described below, uses the partial syndromes for random error detection and correction).

As an example of an iterative decoding process during processing of a data read request, in response to detecting that the codeword for the data is undecodable according to the first correction scheme and that a total number of undecodable codewords that participate in the stripe exceeds the erasure correction capability of the second correction scheme, the data storage device may alternate between performing decode operations on undecoded codewords using the first correction scheme and performing random error correction operations on undecoded stripes using the third correction scheme to reduce a number of errors in the codeword. The iterative process may continue until a number of errors in the codeword has been reduced below the error correction capability of the first and second correction scheme, enabling all remaining errors in the codeword to be corrected using the first and second correction scheme.

Because the stripe parity provides additional error correction capability for the codewords, the codewords may be formed using fewer parity bits than would otherwise be required for "worst-case" error handling. Using fewer parity bits enables reduced power consumption during codeword decoding.

In addition, because the composite generator function is formed from a combination of multiple generator functions, the composite generator function provides random error correction capability. Stripe decoding based on one or more of the generator functions may contribute to correcting errors in a portion of the stripe parity that corresponds to another of the generator functions, enabling random error correction in the stripe parity. Using the composite generator function to generate the stripe parity may therefore provide greater error correction capability as compared to a conventional RAID 6-type storage scheme.

Thus, the systems and methods described below provide several distinctions with respect to traditional RAID-type schemes that may be used in SSDs. One distinction is increased correction capability for the same number of RAID parity pages. For example, using traditional RAID 5 would use an entire parity page for single failure protection, and using traditional RAID 6 would use two parity pages for protection against two failures. Since pages are becoming increasingly larger, there may be multiple ECC codewords in each page. By using codeword-level RAID, the systems and methods described herein can obtain more corrections for the same number of pages for erasure. A second distinction that provides even greater error correction capability is the ability to use iterative random decoding to increase error recovery beyond the erasure limit, such as described in further detail with reference to FIG. 6.

Particular examples in accordance with the disclosure are described below with reference to the drawings. In the description, common features are designated by common reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for identificatoin and ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

FIG. 1 depicts an illustrative example of a system 100 that includes a data storage device 102 and an access device 170 (e.g., a host device or another device). The data storage device 102 includes an ECC engine 136 that is configured to encode stripes of a data structure 110 using a composite generator function 156 and to decode data of the data structure 110 according to a first correction scheme 150, a second correction scheme 152, and/or a third correction scheme 154. The composite generator function 156 may be a multiplicative product of a first generator function 158 and a second generator function 159 and may be used to generate parity bits for each of the stripes of the data structure 110. The composite generator function 156 enables random error correction in addition to erasure correction for the stripes of the data structure 110 using a same amount of additional pages as a traditional RAID-type erasure correction scheme. Thus, more correction capability is provided for the same amount of parity pages as would be used by a RAID-type erasure recovery scheme. In addition, the ECC engine 136 may be configured to perform iterative random decoding to increase error recovery beyond the erasure correction capacity provided for the stripes of the data structure 110.

The data storage device 102 and the access device 170 may be coupled via a connection (e.g., a communication path 180), such as a bus or a wireless connection. The data storage device 102 may include a first interface 132 (e.g., an access device or host interface) that enables communication via the communication path 180 between the data storage device 102 and the access device 170.

The data storage device 102 may include or correspond to a solid state drive (SSD) which may be included in, or distinct from (and accessible to), the access device 170. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 170 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

In some implementations, the data storage device 102 may be embedded within the access device 170, such as in accordance with a Joint Electron Devices Engineering Council (JEDEC) Solid State Technology Association Universal Flash Storage (UFS) configuration. For example, the data storage device 102 may be configured to be coupled to the access device 170 as embedded memory, such as eMMC® (trademark of JEDEC Solid State Technology Association, Arlington, Va.) and embedded SD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 170 (i.e., "removably" coupled to the access device 170). As an example, the data storage device 102 may be removably coupled to the access device 170 in accordance with a removable universal serial bus (USB) configuration.

The data storage device 102 may operate in compliance with an industry specification. For example, the data storage device 102 may include a SSD and may be configured to communicate with the access device 170 using a small computer system interface (SCSI)-type protocol, such as a serial attached SCSI (SAS) protocol. As other examples, the data storage device 102 may be configured to communicate with the access device 170 using a NVM Express (NVMe) protocol or a serial advanced technology attachment (SATA) protocol. In other examples, the data storage device 102 may operate in compliance with a JEDEC eMMC specification, a JEDEC Universal Flash Storage (UFS) specification, one or more other specifications, or a combination thereof, and may be configured to communicate using one or more protocols, such as an eMMC protocol, a universal flash storage (UFS) protocol, a universal serial bus (USB) protocol, and/or another protocol, as illustrative, non-limiting examples.

The access device 170 may include a memory interface (not shown) and may be configured to communicate with the data storage device 102 via the memory interface to read data from and write data to the memory device 103 of the data storage device 102. For example, the access device 170 may be configured to communicate with the data storage device 102 using a SAS, SATA, or NVMe protocol. As other examples, the access device 170 may operate in compliance with a Joint Electron Devices Engineering Council (JEDEC) industry specification, such as a Universal Flash Storage (UFS) Access Controller Interface specification. The access device 170 may communicate with the memory device 103 in accordance with any other suitable communication protocol.

The access device 170 may include a processor and a memory. The memory may be configured to store data and/or instructions that may be executable by the processor. The memory may be a single memory or may include multiple memories, such as one or more non-volatile memories, one or more volatile memories, or a combination thereof. The access device 170 may issue one or more commands to the data storage device 102, such as one or more requests to erase data, read data from, or write data to the memory device 103 of the data storage device 102. For example, the access device 170 may be configured to provide data, such as data 182, to be stored at the memory device 103 or to request data to be read from the memory device 103. The access device 170 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2) memory configuration or a non-monolithic 3D memory configuration (e.g., a stacked die 3D memory configuration).

Although the data storage device 102 is illustrated as including the memory device 103, in other implementations the data storage device 102 may include multiple memory devices that may be configured in a similar manner as described with respect to the memory device 103. For example, the data storage device 102 may include multiple memory devices, each memory device including one or more packages of memory dies, each package of memory dies including one or more memories such as the memory 104. Data striping and error recovery as described with respect to pages of the memory 104 may be extended to include data striping and error recovery across multiple dies, across multiple packages, across multiple memory devices, or any combination thereof.

The memory 104 may include one or more blocks, such as a NAND flash erase group of storage elements. Each storage element of the memory 104 may be programmable to a state (e.g., a threshold voltage in a flash configuration or a resistive state in a resistive memory configuration) that indicates one or more values. Each block of the memory 104 may include one or more word lines. Each word line may include one or more pages, such as one or more physical pages. In some implementations, each page may be configured to store one or more codewords. For example, a page having a size of 16 kilobytes (kB) can store four 4 kB codewords. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write circuitry 105, to support operation of one or more memory dies of the memory device 103. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The memory 104 includes the data structure 110. The data structure 110 includes multiple codewords (e.g., "S" codewords, where S is an integer greater than one), such as a first codeword 160 and one or more additional codewords, including an $S^{th}$ codeword 162. The data structure 110 also includes a first parity codeword 164 on a first page and a second parity codeword 166 on a second page of the memory 104. For example, each of the codewords 160-166 may be stored at separate pages of the memory 104. The data structure 110 is configured to enable each of the codewords 160-166 to be decodable independently of the other codewords 160-166. For example, the first codeword 160 includes parity bits that provide sufficient redundancy to enable the ECC engine 136 to correct bit errors in the first codeword 160 up to the correction capability of the first correction scheme 150. In the event that one or more of the codewords 160-162 contain a number of bit errors that exceeds the correction capability of the first correction scheme 150, stripe codewords corresponding to one or more stripes of the data structure 110 may be processed, such as a first stripe 197 and a $K^{th}$ stripe 199, where K indicates a number of stripes in the data structure 110 and is an integer greater than one. The stripe codewords may be processed by the ECC engine 136 to correct errors in individual stripes.

Figure 2:
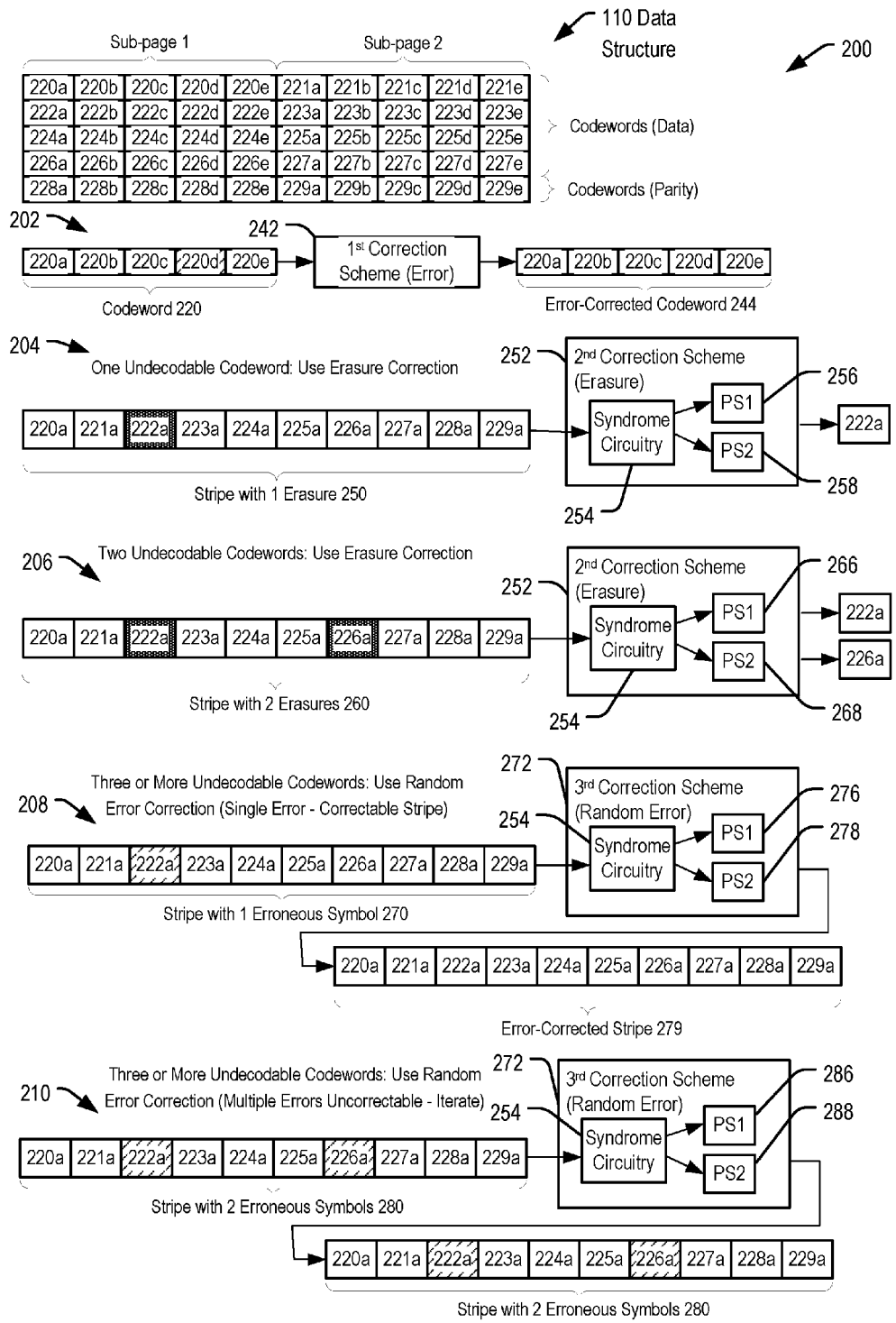
FIG. 2 is a diagram illustrating a particular example of decoding schemes that may be used by the ECC engine of the data storage device of FIG. 1.
Figure 3:
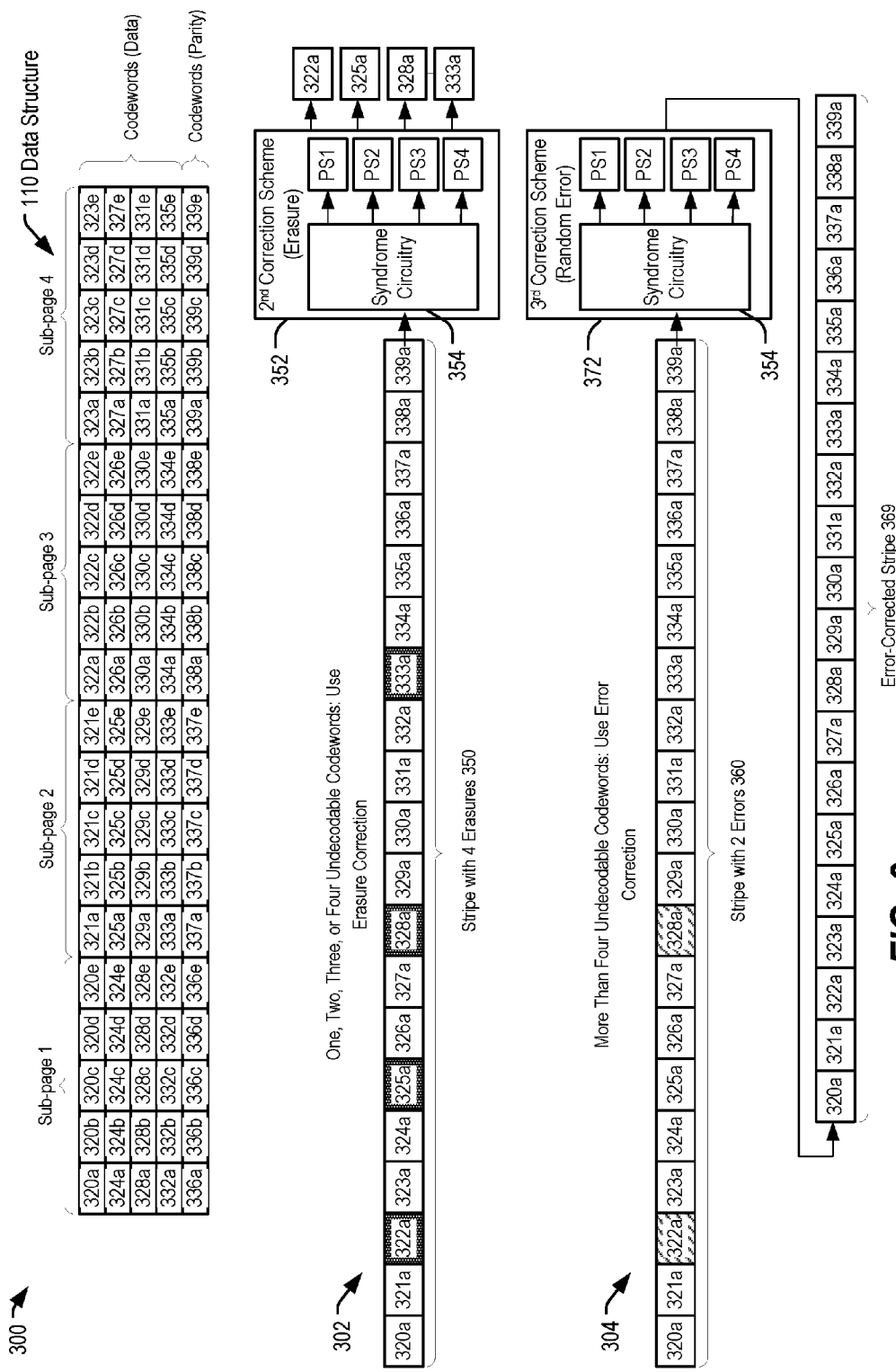
FIG. 3 is a diagram illustrating another particular example of decoding schemes that may be used by the ECC engine of the data storage device of FIG. 1.

Although FIG. 1 depicts the data structure 110 as including a single codeword 160-162 on each page and two parity codewords 164-166, multiple codewords may be stored in each page, and multiple parity codewords may be included in a page. For example, FIG. 2 illustrates an implementation with two data codewords in a page and two parity codewords in a page. FIG. 3 illustrates an implementation with four data codewords in a page and four parity codewords in a page. Although FIG. 2 depicts two parity codewords and FIG. 3 depicts four parity codewords in a page (with each parity codeword corresponding to a factor of a generator polynomial, as described below), in other implementations any number of factors of a generator polynomial and corresponding parity codewords may be used to enable random error correction.

The first stripe codeword includes a first portion 171 of the first codeword 160 and a first portion of one or more of the other codewords, including a first portion 173 of the $S^{th}$ codeword 162. The first portions 171-173 of the codewords 160-162 may be encoded using the composite generator function 156 to generate first parity data corresponding to the first stripe 197. A first portion 175 of the first parity data corresponding to the first stripe 197 is included in the first parity codeword 164 and a second portion 177 of the first parity data corresponding to the first stripe 197 is included in the second parity codeword 166. The second stripe codeword includes a second portion 181 of the first codeword 160 and a second portion of one or more other codewords of the data structure 110, including a second portion 183 of the $S^{th}$ codeword 162. The second stripe codeword also includes a first portion 185 of second parity data corresponding to the $K^{th}$ stripe 199 and a second portion 187 of the second parity data that corresponds to the $K^{th}$ stripe 199.

The controller 130 is coupled to the memory device 103 via a bus 120, an interface (e.g., interface circuitry, such as a second interface 134), another structure, or a combination thereof. For example, the bus 120 may include one or more channels to enable the controller 130 to communicate with a single memory die of the memory device. As another example, the bus 120 may include multiple distinct channels to enable the controller 130 to communicate with each memory die of the memory device 103 in parallel with, and independently of, communication with other memory dies of the memory device 103.

The controller 130 is configured to receive data and instructions from the access device 170 and to send data to the access device 170. For example, the controller 130 may send data to the access device 170 via the first interface 132, and the controller 130 may receive data from the access device 170 via the first interface 132. The controller 130 is configured to send data and commands to the memory 104 and to receive data from the memory 104. For example, the controller 130 is configured to send data and a write command to cause the memory 104 to store data to a specified address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The ECC engine 136 is configured to receive data to be stored to the memory 104 and to generate a codeword. For example, the ECC engine 136 may include an encoder configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 136 may include one or more decoders configured to decode data read from the memory 104 to detect and correct, up to an error correction capability of the ECC scheme, any bit errors that may be present in the data.

For example, the ECC engine 136 may include a first decoder to decode codewords (e.g., codewords 160-166) according to the first correction scheme 150. The ECC engine 136 may include a second decoder to correct erasures in the stripe codewords of the data structure 110 according to the second correction scheme 152. The ECC engine 136 may include a third decoder to correct random errors in stripe codewords of the data structure 110 according to the third correction scheme 154. As a non-limiting example, each of the codewords 160-166 may be encoded using a first encoding scheme (e.g., BCH), each of the codewords of the stripes 197-199 may be encoded using a second encoding scheme (e.g., Reed Solomon), the first correction scheme 150 may include a BCH correction scheme, and the correction schemes 152-154 may include Reed Solomon erasure correction and random correction schemes, respectively. As another non-limiting example, each of the codewords 160-166 may be encoded using a first encoding scheme (e.g., BCH), and each of the codewords of the stripes 197-199 may be encoded using a second encoding scheme (e.g., BCH using a different code rate than the first encoding scheme).

Although the ECC engine 136 is illustrated within the controller 130, in other implementations at least a portion of the ECC engine 136 may be external to the controller 130. For example, an ECC decoding module (e.g., dedicated circuitry, a microprocessor executing instructions to implement a decoding algorithm, or any combination thereof) configured to implement the first ECC scheme 150 may be external to the controller 130 and implemented in a separate device that is packaged with the memory device 103. The ECC engine 136 may therefore represent a distributed collection of one or more ECC encoding and/or ECC decoding modules.

The controller 130 is configured to receive the data 182 from the access device 170 and to encode the data 182 into multiple codewords and multiple stripe codewords to generate the data structure 110 to be stored in the memory 104. For example, the controller 130 may be configured to partition the data 182 into S data words. To illustrate, first data 140 may correspond to a first data word of the data 182 and $S^{th}$ data 142 may correspond to a last data word of the data 182. The controller 130 is configured to encode first data 140 to generate a first codeword 160 that is decodable using the first correction scheme 150. To illustrate, the first codeword 160 may include the first data 140 and first parity bits (P1) 141 based on the first data 140. The controller 130 is further configured to encode second data 142 (e.g., the $S^{th}$ data) to generate the second codeword 162 (e.g., the $S^{th}$ codeword). The second codeword 162 includes the second data 142 and also includes second parity bits (e.g., "PS" parity bits for the $S^{th}$ data) 143 based on the second data 142. Although FIG. 1 illustrates two data words 140 and 142 and two codewords 160 and 162, it should be understood that any number of data words and codewords may be used to generate the data structure 110. For example, S may have a value of 2, 3, 4, 16, 32, 128, or any other integer value greater than one.

The first codeword 160 and the second codeword 162 may be stored in a memory 138 (e.g., a random access memory (RAM) within the controller 130 or RAM (e.g., double data rate type 3 (DDR3) synchronous dynamic RAM (SDRAM)) that is coupled to the controller 130) to enable ECC processing on one or more stripes of the data 140-142 to generate stripe parity data. The controller 130 may be configured to cause the ECC engine 136 to encode multiple stripes of data (e.g., stripes 1 to K (or 0 to K−1), corresponding to multiple columns of multiple bits) from each of the S codewords 160-162 to be encoded using the composite generator function 156 to generate parity bits for each stripe 197-199. The parity bits for each stripe 197-199 are inserted into a first set of parity data 144 and a second set of parity data 146 at locations corresponding to the respective stripes. For example, the controller 130 is configured to generate first parity data that corresponds to the first stripe 197 by encoding the first portions 171-173 of the codewords 160-162 using the composite generator function 156. The controller 130 is further configured to store the first portion 175 of the first parity data corresponding to the first stripe 197 in a first page of the memory 104 and to store the second portion 177 of the first parity data in a second page of the memory 104. Although FIG. 1 illustrates two stripes 197 and 199, it should be understood that any number of stripes may be used. For example, K may have a value of 2, 3, 4, 16, 32, 128, or any other integer value greater than one.

The ECC engine 136 may encode each stripe to generate the sets of parity data for each stripe. The ECC engine 136 may be configured to encode the first sets of parity data 144 to generate the first parity codeword 164 that includes the first set of parity data 144 and parity bits (PA) 145. The ECC engine 136 may be further configured to encode the second set of parity data 146 to generate the second parity codeword 166 that includes the second set of parity data 146 and parity bits (PB) 147.

The composite generator function 156 includes a first generator function 158 and a second generator function 159. The second generator function 159 is distinct from the first generator function 158. For example, as described with respect to FIGS. 4-5, the first generator function 158 may be represented as a first-order polynomial and the second generator function 159 may be represented as another first-order polynomial. The composite generator function 156 may be defined as the product of multiplying the first generator function 158 with the second generator function 159. Using the composite generator function 156 to generate the sets of stripe parity data may provide greater error correction capability than would be provided by using each of the generator functions 158, 159 individually. To illustrate, generating and storing stripe parity using the composite generator function 156 instead of using each of the generator functions 158, 159 individually enables random correction in addition to erasure correction when the stored data is read. As a result, a greater correction capability is provided using a same number of parity pages as a RAID-type protection scheme. For example, a RAID-6 scheme may use two parity pages and enable correction of up to two full-page erasures, while the present disclosure may use one page or a partial page to enable 2 codeword-level erasures and 1-symbol random error correction (in implementations with two codewords per page, such as in FIG. 2) or 4 codeword-level erasures and 2-symbol random error correction (in implementations with four codewords per page, such as in FIG. 3). Examples of the composite generator function 156 and the corresponding sets of stripe parity data are illustrated in further detail with respect to FIGS. 4-5.

The controller 130 may be configured to transfer the codewords 160-166 from the memory 138 for storage into the memory 104 of the memory device 103 to form the data structure 110 in the memory 104. For example, the controller 130 may be configured to sequentially write the codewords 160-166 to consecutively-addressed pages of the memory 104 so that the data structure 110 is aligned in a row-and-column format as depicted in FIG. 1, with the codewords 160-166 forming rows and the stripes 197-199 forming columns in the memory 104. However, in other implementations, the codewords 160-166 may not have any particular alignment or physical relationship to each other in the memory 104, and locations of each of the codewords 160-166 of the data structure 110 may be tracked and maintained by the controller 130. For example, the controller 130 may include a table (not shown) that indicates the physical addresses of each of the S codewords 160-162 and the parity codewords 164-166. The controller 130 may populate the table when the data structure 110 is stored to the memory 104 and may update the table if any of the codewords 160-166 change physical addresses, such as due to garbage collection, wear leveling, or one or more other maintenance operations. The controller 130 may access the table to retrieve physical addresses of the codewords 160-166 in response to one or more of the codewords 160-162 being undecodable using the first correction scheme 150.

Because the data structure 110 includes the sets of stripe parity bits generated by the ECC engine 136, additional error correction capability is provided for the codewords 160-162 beyond the error correction capability provided by the codeword parity (e.g., parity P1 141 and P2 143). The codewords 160-162 may therefore be formed using fewer parity bits than would otherwise be required for "worst-case" error handling, reducing power consumption during decoding of the codewords 160-162. In addition, using the composite generator function 156 to generate the sets of stripe parity may provide greater error correction capability than would be provided by using each of the generator functions 158, 159 individually. In addition, as described further with reference to FIG. 6, further error correction may be obtained by iteratively error-processing codewords and stripes of the data structure 110.

FIG. 2 depicts an example 200 of decoding schemes that may be used by the data storage device 102 of FIG. 1. The data structure 110 is illustrated as including eight data codewords 220, 221, 222, 223, 224, 225, 226, and 227 and two parity codewords 228 and 229. The data structure 110 includes two codewords per page, with codewords 220, 222, 224, 226, and 228 in a first sub-page (sub-page 1) and codewords 221, 223, 225, 227, and 229 in a second sub-page (sub-page 2) of their respective pages. Each of the codewords 220-229 may be generated according to the first ECC scheme 150 of FIG. 1. The data codewords 220-227 may correspond to the data codewords 160-162 of FIG. 1, and the parity codewords 228-229 may correspond to the parity codewords 164-166 of FIG. 1.

Each codeword 220-229 is logically segmented into multiple portions labelled "a," "b," "c," "d," and "e." For example, codeword 220 includes portions 220a, 220b, 220c, 220d, and 220e. The "a" portions of each of the codewords 220-229 form a first stripe, the "b" portions form a second stripe, the "c" portions form a third stripe, the "d" portions form a fourth stripe, and the "e" portions form a fifth stripe. Although eight data codewords 220-227 and two parity codewords 228-229 are depicted, each codeword segmented into five portions to form five stripes, in other implementations the data structure 110 may include any number of data codewords and may be segmented into any number of portions to form stripes.

A first example 202 illustrates a first correction scheme 242 (e.g., the first correction scheme 150 of FIG. 1) operating on an individual codeword of the data structure 110, such as the codeword 220. As illustrated, the portion 220d includes one or more bit errors that are indicated in the figure by hatching. The first correction scheme 242 may correct errors in the codeword 220 up to an error correction capability of the first ECC scheme 150 to generate an error-corrected version of the codeword 244. If the number of errors in the codeword 220 exceeds the error correction capability of the first ECC scheme 150, the first correction scheme 242 may generate an output indicating that the codeword 220 is undecodable using the first correction scheme 242.

A second example 204 illustrates using a second correction scheme 252 (e.g., the second correction scheme 152 of FIG. 1) to perform erasure correction of a stripe 250 that has one erasure at segment 222a. The second correction scheme 252 has a two-erasure correction capability because two generator functions 158 and 159 are used to create the parity segments 228a and 229a for the stripe 250.

The codeword 222 may be undecodable using the first correction scheme 242. Codeword portions 222a-222e may be treated as erasures during decoding of the corresponding stripes using the second correction scheme 252. For example, an error-corrected version of the segment 222a may be generated by processing the stripe 250 at syndrome circuitry 254 to generate a first partial syndrome 256 that corresponds to the first generator function 158 and a second partial syndrome 258 that corresponds to the second generator function 159. Either of the first partial syndrome 256 or the second partial syndrome 258 may be used to generate the codeword portion 222a. The codeword portion 222b may be generated by processing a stripe that includes codeword portions 220b, 221b, 229b (with 222b as an erasure) using the second correction scheme 252. Each of the other portions 222c, 222d, and 222e of the codeword 222 may be generated via processing of the respective stripe by the second correction scheme 252.

A third example 206 illustrates using the second correction scheme 252 to perform erasure correction of a stripe 260 that has two erasures, at segment 222a and at segment 226a. For example, the codeword 222 and the codeword 226 may each be undecodable using the first correction scheme 242. Codeword portions 222a-222e and 226a-226e may be treated as erasures during decoding of the corresponding stripes using the second correction scheme 252. The stripe 260 may be processed by the syndrome circuitry 254 to generate a first partial syndrome 266 that corresponds to the first generator function 158 and a second partial syndrome 268 that corresponds to the second generator function 159. The first partial syndrome 256 and the second partial syndrome 258 may be used in the second correction scheme 252 to generate the codeword portions 222a and 226a. The other portions 222b and 226b, 222c and 226c, 222d and 226d, and 222e and 226e of the codeword 222 and the codeword 226 may be generated via processing of the respective stripe by the second correction scheme 252. Thus, the codewords 222 and 226 that are uncorrectable using the first correction scheme 242 may be reconstructed via erasure processing of each of the stripes using the second correction scheme 252.

A fourth example 208 illustrates using a third correction scheme 272 (e.g., the third correction scheme 154 of FIG. 1) to attempt stripe correction when three or more of the codewords 220-229 are uncorrectable using the first correction scheme 252. In the fourth example 208, codewords 222, 224, and 226 are uncorrectable using the first correction scheme 252. Because the number of uncorrectable codewords (3) exceeds the erasure correction capability (2) of the second correction scheme 252, the third correction scheme 272 is used to attempt random error correction in a stripe 270. The stripe 270 includes the portions 220a-229a and does not treat the codewords 222, 224, and 226 as erasures.

Because two generator functions 158 and 159 are used to create the parity segments 228a and 229a, the third correction scheme 272 has a random error correction capability of one symbol (e.g., one of the codeword portions 220a-229a). As illustrated in the fourth example 208, although codewords 222, 224, and 226 are uncorrectable using the first correction scheme 252, only the codeword 222 has one or more bit errors in its "a" portion 222a, and the portions 224a and 226a are error-free. The syndrome circuitry 254 processes the stripe 270 to generate a first partial syndrome 276 and a second partial syndrome 278. The first partial syndrome 276 and the second partial syndrome 278 are processed to locate and correct the erroneous symbol at portion 222a to generate an error-corrected stripe 279. The syndrome circuitry 254 may also process each of the other stripes (corresponding to portions "b", "c", "d", and "e") to generate first and second partial syndromes for each stripe, and the first and second partial syndromes for each stripe may be processed to locate and correct an erroneous symbol of the stripe to generate an error-corrected stripe when the stripe has a number of erroneous symbols that is within the random error correction capacity (e.g., 1) of the third correction scheme 272.

A fifth example 210 illustrates using the third correction scheme 272 to attempt stripe correction when three or more of the codewords 220-229 are uncorrectable using the first correction scheme 252. In the fifth example 210, codewords 222, 224, and 226 are uncorrectable using the first correction scheme 252 and both codewords 222 and 226 include one or more bit error in their "a" portions 222a and 226a. A stripe 280 with erroneous symbols at portions 222a and 226a is processed at the syndrome circuity 254 to generate partial syndromes 286 and 288. Because the number of uncorrectable symbols (2) exceeds the random error correction capability (1) of the third correction scheme 272, processing of the partial syndromes 286 and 288 results in a determination that the stripe 280 is uncorrectable using the third correction scheme 272, and the third correction scheme 272 does not modify the stripe 280.

Even though the portions 222a and 226a are not correctable using any of the correction schemes 242, 252, or 272, an iterative process may be performed that may enable correction of the portions 222a and 226a. For example, although stripe "a" may not be correctable using the third error correction scheme 272, one or more of the other stripes "b"-"e" may be corrected using the third correction scheme 272. For example, stripe "b" may only include errors in portion 226b, enabling correction of portion 226b. After processing the stripes of the data structure 110 using the third error correction scheme 272, each of the previously uncorrected codewords 222, 224, and 226 may be again processed using the first correction scheme 242.

To illustrate, correction of portion 226b may enable codeword 226 to be corrected using the first correction scheme 242. Correction of codeword 226 reduces the number of remaining uncorrectable codewords (codewords 222 and 224) to within the erasure correction capability of the second correction scheme 252, enabling correction of the remaining uncorrectable codewords. One or more iterations of processing codewords using the first correction scheme 242 followed by processing stripes using the third correction scheme 272 may be performed until all data codewords 220-227 are corrected or until no portions are able to be corrected during an iteration. An example of such iterative decoding is described in further detail with reference to FIG. 6.

FIG. 3 depicts another example 300 of decoding schemes that may be used by the data storage device 102 of FIG. 1. The data structure 110 is illustrated as including 16 data codewords 320-335 and four parity codewords 336-339. The data structure 110 includes four codewords per page, with codewords 320, 324, 328, 332, and 336 in a first sub-page (sub-page 1), codewords 321, 325, 329, 333, and 337 in a second sub-page (sub-page 2), codewords 322, 326, 330, 334, and 338 in a third sub-page (sub-page 3), and codewords 323, 327, 331, 335, and 339 in a fourth sub-page (sub-page 4) of their respective pages. Each of the codewords 320-339 may be generated according to the first ECC scheme 150 of FIG. 1. The data codewords 320-335 may correspond to the data codewords 160-162 of FIG. 1, and the parity codewords 336-339 may correspond to parity generated according to a composite generator polynomial composed of four generator functions (as compared to the two generator functions of the example of FIG. 2).

Each codeword 320-339 is logically segmented into multiple portions labelled "a," "b," "c," "d," and "e." The "a" portions of each of the data codewords 320-339 form a first stripe, the "b" portions form a second stripe, the "c" portions form a third stripe, the "d" portions form a fourth stripe, and the "e" portions form a fifth stripe. Although 16 data codewords 320-335 and four parity codewords 336-339 are depicted, each codeword segmented into five portions to form five stripes, in other implementations the data structure 110 may include any number of data codewords and may be segmented into any number of portions to form stripes.

A first correction scheme, such as the first correction scheme 242 of FIG. 2, may enable random error correction within individual codewords. To illustrate, each of the codewords 320-339 may be individually decoded as described with reference to the first correction scheme 242 of FIG. 2.

A first example 302 illustrates a second correction scheme 352 to perform erasure correction of a stripe 350, and a second example 304 illustrates a third correction scheme 372 to perform random error correction of a stripe 360. Because parity for each stripe is generated using a composite of four generator functions, the second correction scheme 352 may have an erasure correction capacity to correct up to four erasures, and the third correction scheme 372 may have an error correction capacity to locate and correct up to two errors.

In the first example 302, a stripe 350 having four erasures is depicted. The erasures at portions 322a, 325a, 328a, and 333a indicate that the first correction scheme 242 was able to correct all codewords in the data structure 110 except codewords 322, 325, 328, and 333. The stripe 350 may be processed by syndrome circuitry 354 to generate four partial syndromes. The four partial syndromes are processed to generate corrected versions of the portions 322a, 325a, 328a, and 333a. Each of the other stripes for portions "b," "c," "d," and "e" may be processed using the second correction scheme 352 to generate corrected versions of the respective portions of the codewords 322, 325, 328, and 333.

In the second example 304, five or more codewords including codewords 322 and 328 are uncorrectable using the first correction scheme. The stripe 360 includes the portions 320a-339a. As illustrated in the second example 304, although five codewords are uncorrectable using the first correction scheme 252, only the codewords 322 and 328 have one or more bit errors in their "a" portion 322a and 328a, respectively. The syndrome circuitry 354 processes the stripe 260 to generate four partial syndromes that are processed to locate and correct the erroneous symbols at portions 222a and 228a to generate an error-corrected stripe 369. The syndrome circuitry 354 may also process each of the other stripes (corresponding to portions "b", "c", "d", and "e") to generate four partial syndromes for each stripe, and the partial syndromes for each stripe may be processed to locate and correct erroneous symbols of the stripe to generate an error-corrected stripe when the stripe has a number of erroneous symbols that is within the random error correction capacity (e.g., 2) of the third correction scheme 372.

Error correction may proceed by first attempting to correct codewords using the first correction scheme 242. If four or fewer codewords are uncorrectable using the first correction scheme 242, then the uncorrected codewords are generated using the second correction scheme 352. Otherwise, if more than four codewords are uncorrectable using the first correction scheme 242, correction of each stripe is attempted using the third correction scheme 372. If any stripe is uncorrectable using the third correction scheme 372, iterative decoding may be performed as indicated in FIG. 2 and as described in further detail with reference to FIG. 6.

Figure 4:
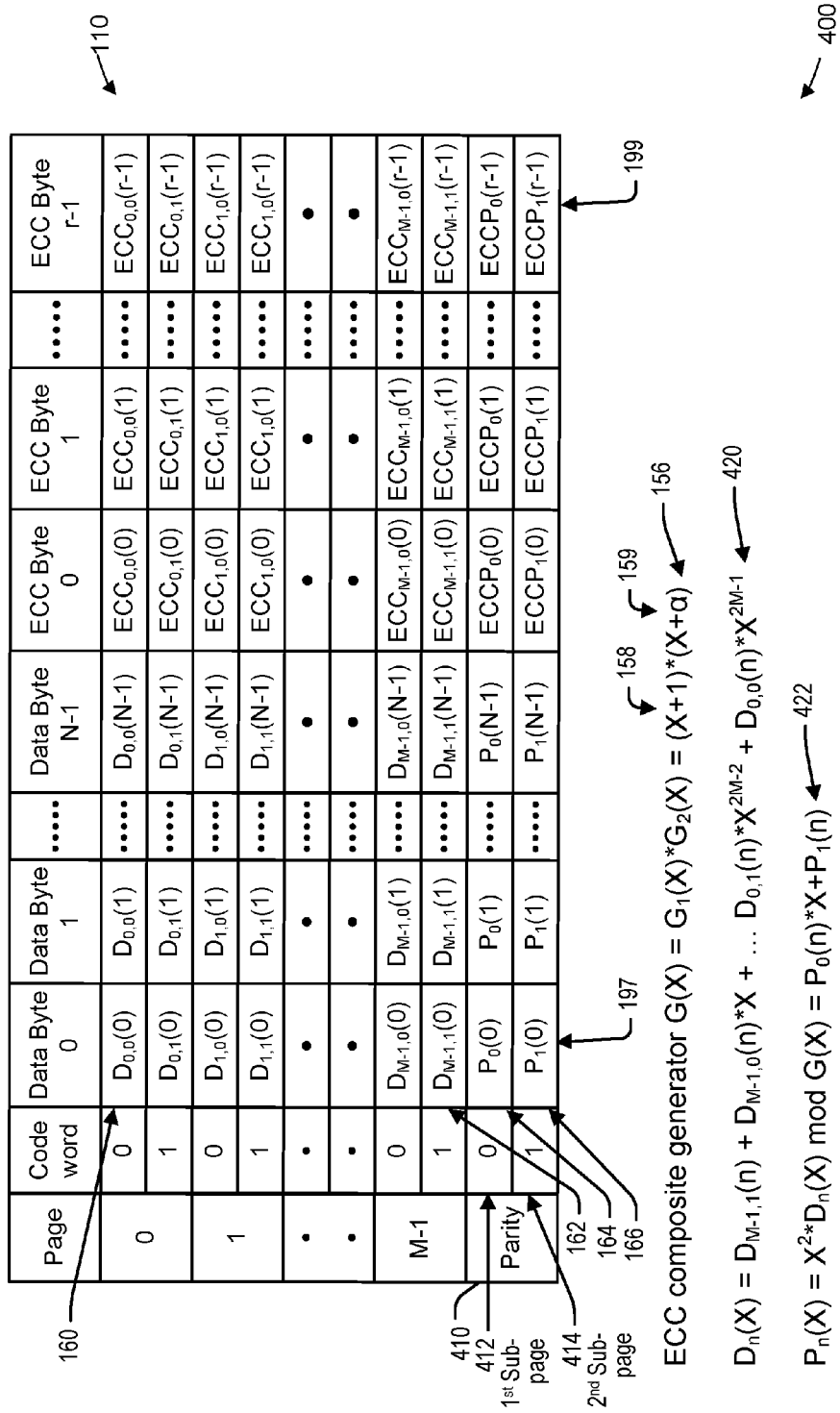
FIG. 4 is a diagram illustrating a particular example of a data encoding scheme that uses a composite generator function and that may be used by the ECC engine of the data storage device of FIG. 1.

FIG. 4 depicts an example of a data encoding scheme 400 that may be used by the data storage device 102 of FIG. 1. According to the data encoding scheme 400, the data structure 110 stores two codewords (codeword "0" and codeword "1") at each of "M" pages of the memory 104 of FIG. 1, where M is an integer greater than zero. For example, the data structure 110 may include S (i.e., the number of codewords 160-162 of FIG. 1)=2M codewords when each page is sized to store two codewords, including a "codeword 0" in a first sub-page of the page and a "codeword 1" in a second sub-page of the page. Although FIG. 4 illustrates two sub-pages per memory page, in other implementations there may be any number of sub-pages per memory page.

Each codeword includes "N" data bytes and "r" ECC bytes (i.e., r bytes of parity bits that are generated based on the N data bytes), where N and r are integers greater than zero. Although the right-most column of the data structure 110 indicates an ECC byte ("ECC Byte r-1"), in some implementations the ECC data may not be an integral number of bytes and the right-most column may represent a partial byte of ECC data.

A parity portion 410 of the data structure 110 includes the first parity codeword 164 and the second parity codeword 166. The first parity codeword 164 is stored in a first sub-page 412 of a page and the second parity codeword 166 is stored in a second sub-page 414 of the page.

Each "stripe" of the data structure 110 illustrated in FIG. 4 is a byte (i.e., 8 bits) wide. Each data byte and each ECC byte is in a stripe of the data structure 110. For example, the first stripe 197 may correspond to the first data byte (data byte 0) of each of the codewords, and the $K^{th}$ stripe 199 (where K=N+r) may correspond to the last data byte (ECC byte r-1) of each of the codewords.

The composite generator function 156 is depicted in polynomial form as G(X). In the example of FIG. 4, G(X) is formed as the product of the first generator function 158 ($G_1(X)$) and the second generator function 159 ($G_2(X)$). The first generator function 158 is represented as a first degree polynomial that includes a first constant (i.e., X+1) and the second generator function 159 is represented as another first degree polynomial that includes a second constant (i.e., X+α). In this example, the second constant α is based on a Galois finite field, illustrative of a Reed Solomon ECC.

The composite generator function 156 is applied to a data word $D_n(X)$ 420 corresponding to the $n^{th}$ stripe (where n is an integer from 0 to N+r-1) to generate stripe parity $P_n(X)$ 422 for the $n^{th}$ stripe. The stripe parity $P_n(X)$ 422 is partitioned into a first portion $P_0(n)$ (e.g., the first portion 175 of FIG. 1) that is stored in the first sub-page 412 and a second portion $P_1(n)$ (e.g., the second portion 177 of FIG. 1) that is stored in the second sub-page 414.

The data structure 110 depicted in FIG. 4 provides additional error correction capability for the codewords 160-162 beyond the error correction capability provided by the codeword parity (e.g., bytes ECC0,0(0)-ECC0,0(r-1) for the first codeword 160). The codewords 160-162 may therefore be formed using fewer parity bits than would otherwise be required for "worst-case" error handling, reducing power consumption during decoding of the codewords 160-162. In addition, using the composite generator function 156 to generate the sets of stripe parity may provide greater error correction capability than would be provided by using each of the generator functions 158, 159 individually without increasing the amount of parity that is stored for each stripe.

Figure 5:
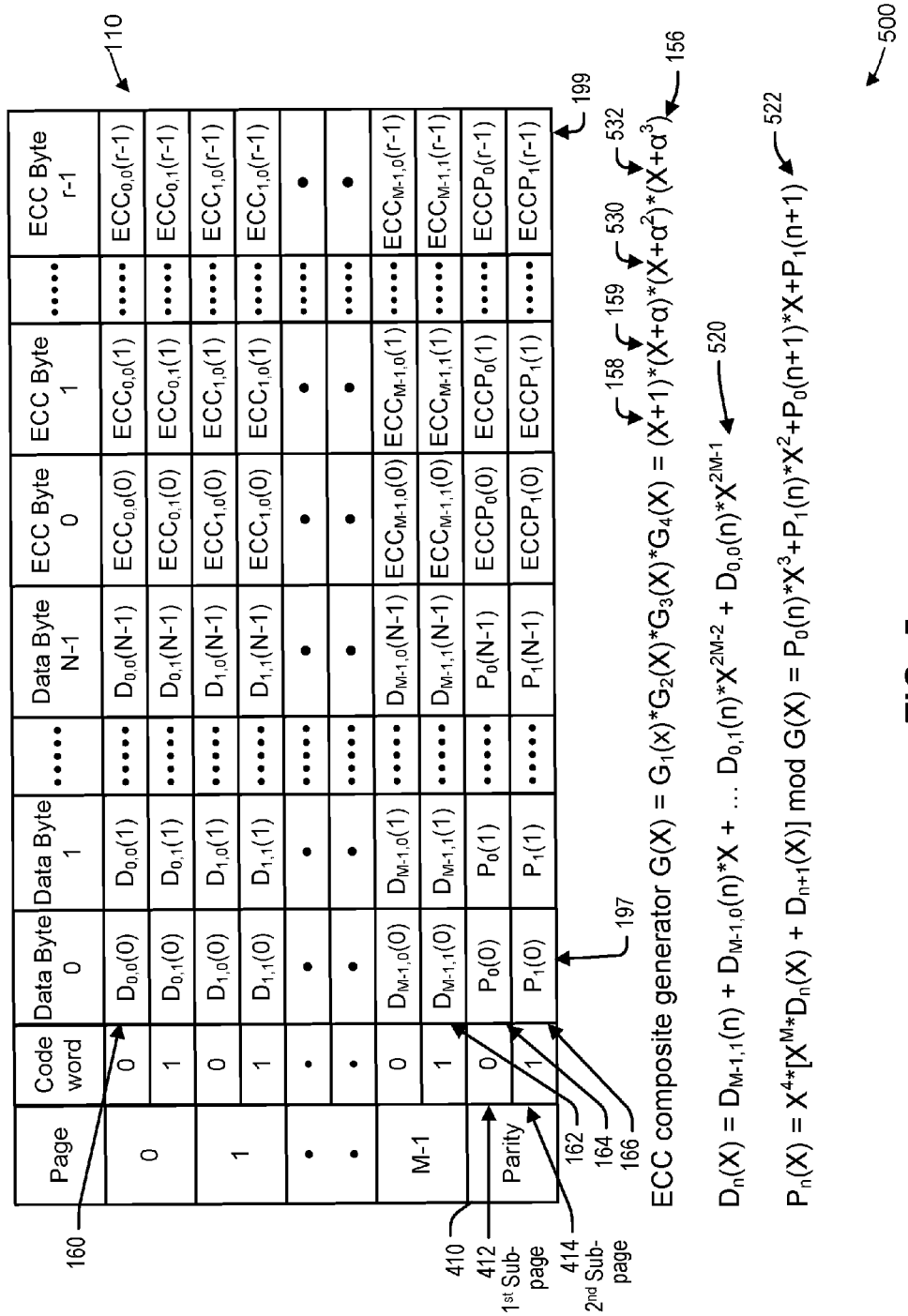
FIG. 5 is a diagram illustrating another particular example of a data encoding scheme that uses a composite generator function and that may be used by the ECC engine of the data storage device of FIG. 1.

FIG. 5 depicts an example of another data encoding scheme 500 that may be used by the data storage device 102 of FIG. 1. The stripe parity data in the data structure 110 of the data encoding scheme 500 is generated by different composite generator function 156 than the stripe parity data the data structure 110 of FIG. 4.

The composite generator function 156 is depicted in polynomial form as G(X). In the example of FIG. 5, G(X) is formed as the product of four generator functions: the first generator function 158 ($G_1(X)$) of FIG. 4, the second generator function 159 ($G_2(X)$) of FIG. 4, a third generator function 530 ($G_3(X)$), and a fourth generator function 532 ($G_4(X)$). The first generator function 158 is represented as a first degree polynomial that includes a first constant (i.e., X+1), the second generator function 159 is represented as a first degree polynomial that includes a second constant (i.e., X+α), the third generator function 530 is represented as a first degree polynomial that includes a third constant (i.e., $X+α^2$), and the fourth generator function 532 is represented as a first degree polynomial that includes a fourth constant (i.e., $X+α^3$), where α, $α^2$, and $α^3$ are elements of a Galois field (e.g., illustrative of a Reed Solomon code).

The composite generator function 156 is applied to a combination of a data word $D_n(X)$ 520 corresponding to the $n^{th}$ stripe and a data word $D_{n+1}(X)$ corresponding to the $(n+1)^{th}$ stripe to generate stripe parity $P_n(X)$ 522. The stripe parity $P_n$ (X) 522 is generated according to $P_n(X)=X^{4}*[X^M*D_n(X)+D_{n+1}(X)]$ mod G(X). The stripe parity $P_n(X)$ 522 is expressed as a function of a first portion $P_0(n)$ (e.g., the first portion 175 of FIG. 1) that is stored in the first sub-page 412 for stripe n, a second portion $P_1(n)$ (e.g., the second portion 177 of FIG. 1) that is stored in the second sub-page 414 for stripe n, a third portion $P_0(n+1)$ that is stored in the first sub-page 412 for stripe n+1, and a fourth portion $P_1(n+1)$ that is stored in the second sub-page 414 for stripe n+1. As illustrated in FIG. 5, $P_n(X)$ 522 may be expressed as $P_0(n)*X^3+P_1(n)*X^2+P_0(n+1)*X+P_1(n+1)$. Although $P_n(X)$ is described as a concatenation of $D_n(X)$ followed by $D_{n+1}(X)$, in other implementations the concatenation could be in the opposite order (e.g., $D_{n+1}(X)$ followed by $D_n(X)$) or the data polynomials $D_n(X)$ and $D_{n+1}(X)$ could be interleaved in any particular order. Also, in other implementations parity symbols may be assigned to storage locations other than as illustrated without changing the principle of operation.

A two-erasure correction capability is provided for each stripe illustrated in FIG. 5 as a result of each stripe codeword having two parity bytes (e.g., $P_0(n)$ and $P_1(n)$ for stripe n, $P_0(n+1)$ and $P_1(n+1)$ for stripe n+1). In addition, a two-symbol (e.g., 2-byte) random error correction capability is provided for each pair of adjacent stripes as a result of each pair of adjacent stripes participating in a single codeword. The two-symbol random error correction may be used to correct up to two errors in the first stripe (e.g., in the data portion or parity portion of stripe n), or up to two errors in the second stripe (e.g., in the data portion or parity portion of stripe n+1), or a single error in each of the first and second stripes (e.g., one error in the data portion or parity portion of stripe n and one error in the data portion or parity portion of stripe n+1).

By using stripe parity that includes a greater number of parity bits than the encoding scheme 400 of FIG. 4, each stripe that is encoded using the composite generator function 156 of FIG. 5 may be provided with a greater random error correction capability (e.g., up to two errors in a single stripe) as compared to the encoding scheme 400 of FIG. 4. In addition, increasing the error correction capability decreases a probability of miscorrection of a stripe, reducing a potential source of errors during decoding of data in the data encoding scheme 500.

Figure 6:
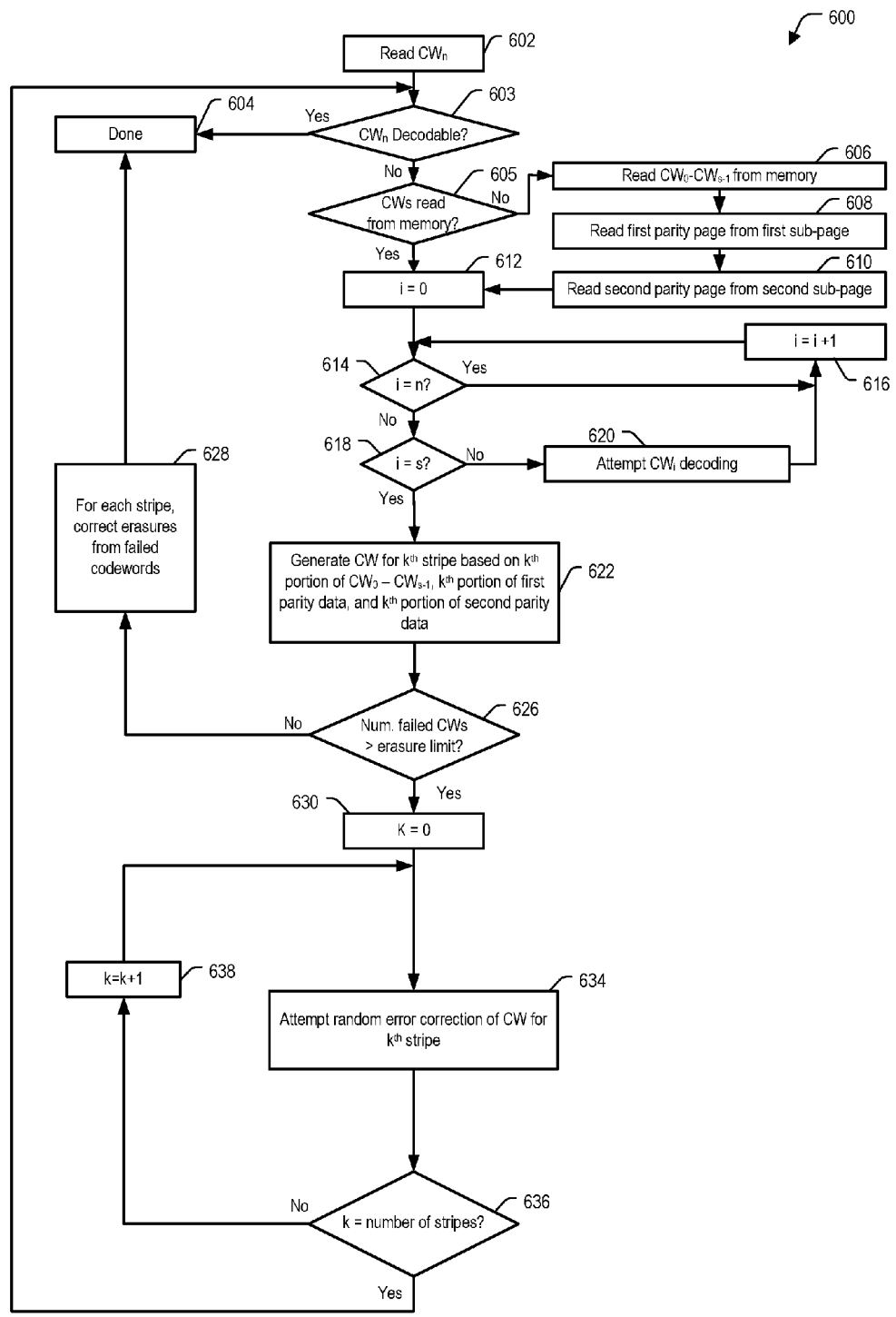
FIG. 6 is a flow diagram of a particular example of a method of decoding data that may be performed by the data storage device of FIG. 1.

Referring to FIG. 6, a particular implementation of a method 600 that may be performed by the controller 130 of the data storage device 102 of FIG. 1 is depicted. Although the method 600 is described with reference to the data storage device 102 of FIG. 1, in other implementations the method 600 may be performed by a device other than the data storage device 102 of FIG. 1.

The method 600 may be used in response to a request to read a particular codeword, $CW_n$. The method 600 includes reading $CW_n$ from the memory 104, at 602. For example, $CW_n$ may correspond to the first codeword 160 of FIG. 1. A determination may be made, at 603, as to whether $CW_n$ is decodable. For example, the controller 130 may route the representation of the first codeword 160 that is read from the memory 104 to the ECC engine 136 to initiate decoding according to the first correction scheme 150. In response to detecting that the $CW_n$ is decodable, an error corrected version of the data of $CW_n$ may be provided to the requestor, such as the access device 170 of FIG. 1, and the method 600 may end, at 604.

In response to determining that $CW_n$ is not decodable, a determination may be made whether the remaining codewords of the data structure 110 have been read from the memory 104, at 605. If the remaining codewords have been read from the memory, a loop counter "i" is initialized (e.g., i=0), at 612. Otherwise, if the remaining codewords of the data structure 110 have not been read from the memory 104, the remaining codewords of the data structure 110 may be read from the memory 104, at 606. The remaining codewords are designated as codewords $CW_0$-$CW_{S-1}$, where S indicates the number of non-parity codewords in the data structure 110. The codewords that are read from the memory 104 may be stored at a memory of the controller 130, such as the memory 138, for access by the ECC engine 136 during decode operations. Alternatively, one or more of the codewords may not be stored in the memory 138, such as if the memory 138 does not have sufficient capacity to store all of the codewords $CW_0$-$CW_{S-1}$. Instead, the memory 138 may store the uncorrectable codewords and the partial syndromes generated during the stripe decoding. During each iteration the stripe syndromes may be updated by decoding the corrected stripes using 0 data for the uncorrected codeword locations in the stripe and then XORing those updated partial syndromes with the original partial syndromes. A first parity page (e.g., the first parity codeword 164 of FIG. 1) may be read from a first sub-page of a page of the memory 104, such as a flash memory, at 608, and a second parity page, such as the second parity codeword 166 of FIG. 1, may be read from a second sub-page of the page of the memory 104, at 610. Processing continues with setting the loop counter "i" to the initial value (e.g., 0), at 612.

A determination is made whether i=n, at 614. If i=n, then i is incremented, at 616. In response to determining that i is not equal to n, at 614, a determination is made whether i is equal to S, at 618. In response to determining that i is not equal to S, at 618, the controller 130 may attempt to decode the $i^{th}$ codeword ($CW_i$), at 620. For example, attempting to decode $CW_i$ may include determining whether $CW_i$ has been decoded, and if $CW_i$ has not been decoded, providing a representation of the $i^{th}$ codeword to the ECC engine 136 to perform a decode operation according to the first correction scheme 150. After attempting to decode $CW_i$, i is incremented, at 616.

When i=S, at 618, a decoding operation has been attempted for each of the (non-parity) codewords of the data structure 110. The controller 130 may also attempt decoding of the first parity data (e.g., the first parity codeword 164 of FIG. 1) and the second parity data (e.g., the second parity codeword 166 of FIG. 1), such as in parallel with the reading and decoding of the codewords of the data structure, according to the first correction scheme 150.

A codeword for each of the stripes may be generated, at 622. For example, for each value of k, from 0 to the number of stripes—1, the $k^{th}$ stripe may be generated based on the $k^{th}$ portion of each of the codewords $CW_0$-$CW_{S-1}$, the $k^{th}$ portion of the first parity data, and the $k^{th}$ portion of the second parity data. To illustrate, the first stripe 197 of FIG. 1 may be generated based on the first portions 171, 173 of each of the codewords 160, 162 and the first portion 175 and the second portion 177 of the first parity data.

A number of the undecoded codewords 160-166 of the data structure 110 is compared to an erasure correction capacity of the second correction scheme 152 of FIG. 1, at 626. In response to the number of undecoded codewords not exceeding the erasure correction capacity, each stripe may be processed to correct erasures from the undecoded codewords, at 628. For example, if only one or two codewords including the first codeword 160 of FIG. 1 remain undecoded, erasure correction of the first stripe 197 of FIG. 1 may be used to recover the first portion 171 of the first codeword 160. After erasure correction of each stripe, the error corrected version of the data of $CW_n$ may be provided to the requestor, such as the access device 170 of FIG. 1, and the method 600 may end, at 604.

Otherwise, if the number of undecoded codewords exceeds the erasure correction capacity, at 626, each stripe is processed using the third correction scheme 154 to perform random error correction in a stripe-by-stripe, rowby-row iterative decoding process. To illustrate, a loop counter "k" is initialized to an initial value, e.g., k=0, at 630. The loop counter k may indicate a stripe index of stripes of the data structure 110.

A determination is made as to whether the codeword for the $k^{th}$ stripe is decodable by attempting random error correction of the kth stripe, at 634. For example, the first stripe codeword may be provided to the ECC engine 136 to attempt a decoding operation according to the third correction scheme 154. Miscorrections that may occur during random error correction of each stripe may be reduced or eliminated by only allowing changes at stripe locations corresponding to the undecoded codewords. A determination is made, at 636, as to whether all stripes of the data structure 110 have been processed (i.e., if k equals the number of stripes (K) in the data structure 110). If any stripes have not been processed, then the loop counter k is incremented, at 638, and processing returns to attempting random error correction of the next stripe, at 634. Otherwise, processing returns to 603 to determine whether the codeword n is decodable, at 603.

By first attempting decoding of each of the codewords and next attempting decoding of each stripe, individual sections of the various codewords may be error corrected. For example, correction of errors in a stripe may improve the likelihood of decoding success for one or more of the codewords 160-162. Likewise, successful decoding of one of the codewords 160-162 further increases the probability of successful decoding of one or more of the stripes of the data structure 110. Iteratively alternating between decoding columns (e.g., stripes) and decoding rows (e.g., codewords) of the data structure 110 enables correction of errors in one or more of the columns to increase a likelihood that one or more of the rows will become decodable. Similarly, correction of errors in one or more of the rows increases a likelihood that one or more of the columns will become decodable. Iteratively alternating between decoding columns (e.g., stripes) and decoding rows (e.g., codewords) of the data structure 110 can result in correction of a sufficient number of bits in the $n^{th}$ codeword to enable decoding of the $n^{th}$ codeword and sending of an error corrected version of the requested data to the access device 170 of FIG. 1.

Although FIG. 6 depicts decoding in an implementation that includes two parity codewords corresponding to a two-factor generator function, such as illustrated in FIGS. 1, 2, and 4, the process illustrated in FIG. 6 may be modified for use in implementations that use more than two factors of a generator faction. To illustrate, FIG. 5 provides an example of creating larger stripe codewords by concatenating (or interleaving) data from multiple columns of the data structure 110 that are encoded with higher-order parity (e.g., a four-factor generator function) for increased random error correction capability. The process of FIG. 6 may therefore include concatenating adjacent columns to form the larger stripes, at 622. As another example, the process of FIG. 6 may be modified for the data structure of FIG. 3 by increasing the number of parity pages read from the sub-pages, at 608-610.

Figure 7:
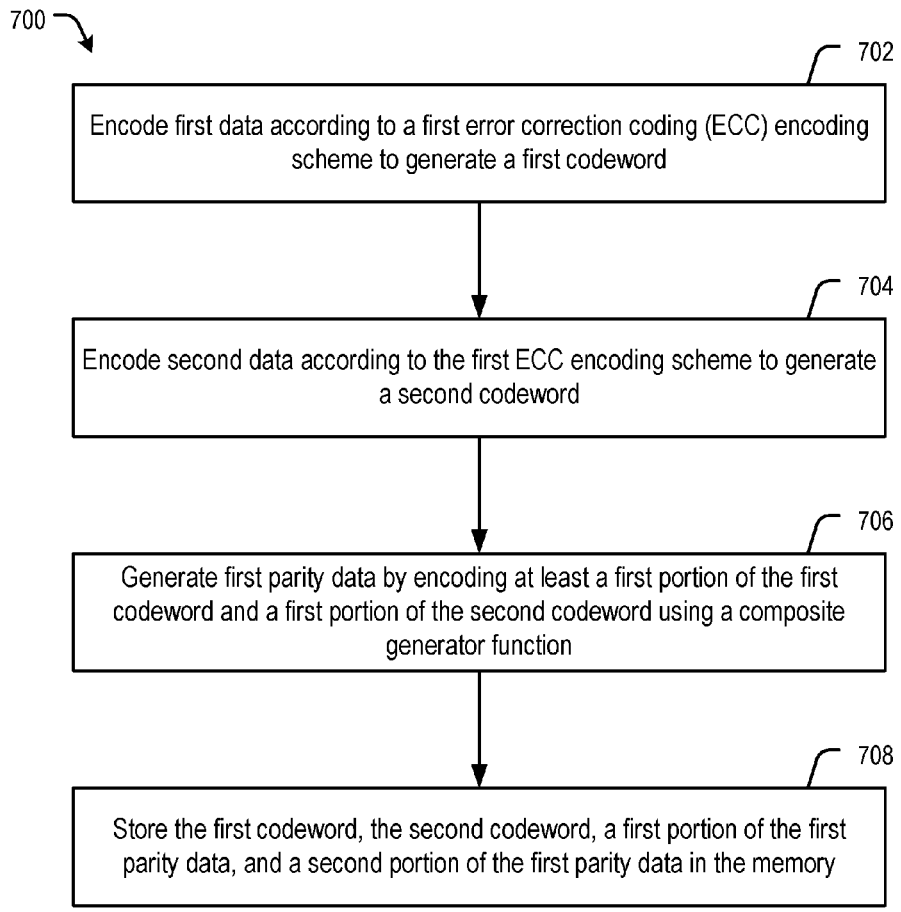
FIG. 7 is a flow diagram of a particular example of a method of encoding data that may be performed by the data storage device of FIG. 1.

Referring to FIG. 7, a particular illustrative example of a method of encoding data is depicted and generally designated 700. The method 700 may be performed at a data storage device, such as at the data storage device 102 of FIG. 1. One or more operations of the method 700 may be performed or initiated by the controller 130, such as in response to a data write request from the access device 170 of FIG. 1.

The method 700 includes encoding first data according to a first error correction coding (ECC) encoding scheme to generate a first codeword, at 702. For example, the first data 140 of FIG. 1 is encoded according to the first ECC encoding scheme to generate the first codeword 160 that includes the first data 140 and the parity bits 141.

Second data is encoded according to the first ECC scheme to generate a second codeword, at 704. For example, the second data 142 of FIG. 1 is encoded according to the first ECC encoding scheme to generate the second codeword 162 that includes the second data 142 and the parity bits 143.

First parity data is generated by encoding at least a first portion of the first codeword and a first portion of the second codeword using a composite generator function, at 706. For example, when the data structure 110 includes 32 codewords (i.e., S=32), the portions 171-173 (i.e., 32 portions) of the codewords 160-162 (i.e., 32 codewords) corresponding to the first stripe 197 of FIG. 1 may be combined and encoded by the ECC engine 136 using the composite generator function 156 to generate the first parity data that includes the first portion 175 and the second portion 177.

The first codeword, the second codeword, the first portion of the first parity data, and the second portion of the first parity data are stored in a memory, at 708. For example, the first portion of the first parity data may be stored in a first sub-page of a page of a memory and the second portion of the first parity data may be stored in a second sub-page of the page of the memory. For example, the method 700 may include generating the first parity codeword 164 of FIG. 1 that encodes the first portion 175 of the first parity data and generating the second parity codeword 166 of FIG. 1 that encodes the second portion 177 of the first parity data. The first portion 175 may be stored in the first sub-page 412 of FIGS. 4-5 as part of the first parity codeword 164 and the second portion 177 may be stored in the second sub-page 414 of FIGS. 4-5 as part of the second parity codeword 166. As another illustrative, non-limiting example, the first portion of the first parity data may be stored as the portion 228a of the parity codeword 228 and the second portion of the first parity data may be stored as the portion 229a of the parity codeword 229 of FIG. 2.

The method 700 may include generating stripe parity for multiple stripes of the data structure 110 of FIG. 1. For example, the method 700 may include generating second parity data by encoding at least a second portion of the first codeword 160 (e.g., the portion 181 in the $K^{th}$ stripe 199) and a second portion of the second codeword 162 (e.g., the portion 183 in the $K^{th}$ stripe 199) using the composite generator function 156 of FIG. 1. The first portion of the second parity data may be stored in the first sub-page (e.g., as portion 228b of the parity codeword 228 of FIG. 2) and the second portion of the second parity data may be stored in the second sub-page (e.g., as portion 229b of the second parity codeword 229 of FIG. 2). In an implementation where K=1024, 1024 stripes may be encoded using the composite generator function 156 to generate 1024 sets of stripe parity data. Each of the 1024 sets of stripe parity data may be partitioned into a first portion to generate the parity data 144 of FIG. 1 and a second portion to generate the parity data 146 of FIG. 1.

The composite generator function may include a first generator function and a second generator function that is distinct from the first generator function. For example, the composite generator function may include the first generator function 158 and the second generator function 159 of FIG. 1. The first portion 175 of the first parity data may correspond to the first generator function 158 and the second portion 177 of the first parity data may correspond to the second generator function 159.

By encoding data using the codewords (e.g., the codewords 160-166) and stripes (e.g., the stripes 197-199), additional error correction capability is provided for the codewords beyond the error correction capability provided by the codeword parity. The codewords may use fewer parity bits than would otherwise be required for "worst-case" error handling, increasing the storage density of the memory. In addition, using the composite generator function to generate stripe parity data provides greater error correction capability than would be provided by using the first generator function and the second generator function individually by providing error correction capability and erasure correction capability.

Although the method 700 is described with reference to the two-parity cases of FIGS. 1 and 2, in other examples the method 700 may apply to other cases such as the four-parity case of FIG. 3. For example, the first parity data generated at 706 may include more than two portions, such as the four-portion parity of FIG. 3. At 708, the first portion of the first parity data may be stored as the portion 336a of the parity codeword 336, the second portion of the first parity data may be stored as the portion 337a of the parity codeword 337, a third portion of the first parity data may be stored as the portion 338a of the parity codeword 338, and a fourth portion of the first parity data may be stored as the portion 339a of the parity codeword 339 of FIG. 3.

Figure 8:
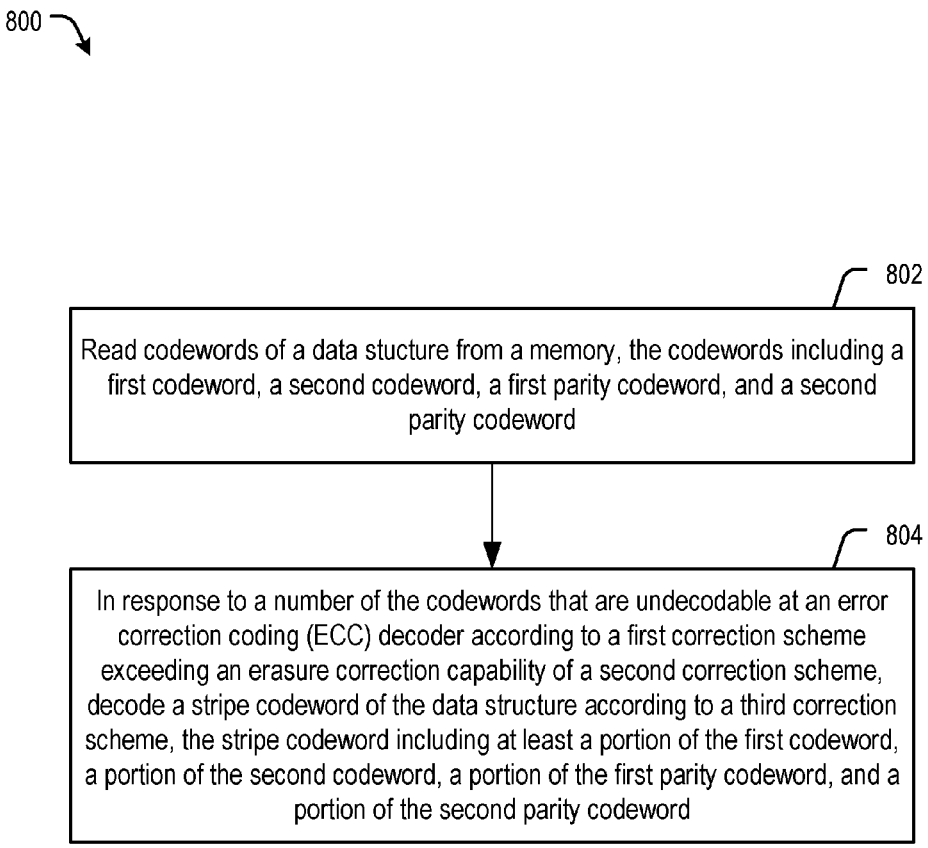
FIG. 8 is a flow diagram of another particular example of a method of decoding data that may be performed by the data storage device of FIG. 1.

Referring to FIG. 8, a particular illustrative example of a method of decoding data is depicted and generally designated 800. The method 800 may be performed at a data storage device, such as at the data storage device 102 of FIG. 1. One or more operations of the method 800 may be performed or initiated by the controller 130, such as in response to a data read request from the access device 170 of FIG. 1.

The method 800 includes reading codewords of a data structure from a memory, the codewords including a first codeword, a second codeword, a first parity codeword, and a second parity codeword, at 802. For example, the first codeword 160 of FIG. 1 may be read from the memory 104. The the first codeword 160 that is read from the memory 104 may include multiple bit errors that may have occured while in the memory 104. The first codeword 160 including the bit errors may be stored in the memory 138 and provided to the ECC engine 136 for decoding using the first correction scheme 150. As another example, the first codeword, the second codeword, the first parity codeword, and the second parity codeword may correspond to the codewords 220, 222, 226, and 228, respectively, of FIG. 2.

In response to a number of the codewords that are undecodable at an error correction coding (ECC) decoder according to a first correction scheme exceeding an erasure correction capability of a second correction scheme, a stripe codeword of the data structure is decoded according to a third correction scheme, the stripe codeword including at least a portion of the first codeword, a portion of the second codeword, a portion of the first parity codeword, and a portion of the second parity codeword, at 804. For example, when the number of codewords of the data structure 110 that are undecodable by the ECC engine 136 is determined to be within the erasure correction capability of the second correction scheme, the controller 130 may correct the undecoded codewords using the second correction scheme. Otherwise, the controller 130 may use the third correction scheme to attempt to correct random errors in each stripe of the data structure 110.

The method 800 may include, after decoding the stripe codeword, initiating a decode operation of a modified version of the first codeword according to the first correction scheme, the modified version of the first codeword including an error-corrected version of the portion of the first codeword. To illustrate, decoding the first stripe 197 of FIG. 1 results in correction of any errors that may be present in the first portion 171 of the first codeword 160. Decoding the modified version of the first codeword 160 that includes the error-corrected version of the first portion 171 increases the likelihood that the modified version is decodable using the first correction scheme 150.

Although the method 800 is described with reference to the two-parity cases of FIGS. 1 and 2, in other examples the method 800 may apply to other cases such as the four-parity case of FIG. 3. For example, the codewords read at 802 may include more than two parity codewords, such as the parity codewords 336, 337, 338, and 339 of FIG. 3. At 804, the stripe codeword that is decoded according to the third correction scheme may include the portion 336a of the parity codeword 336, the portion 337a of the parity codeword 337, the portion 338a of the parity codeword 338, and the portion 339a of the parity codeword 339 of FIG. 3.

Although the controller 130 and certain other components described herein are illustrated as block components and described in general terms, such components may include one or more microprocessors, state machines, and/or other circuits configured to enable the data storage device 102 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein.

Alternatively or in addition, one or more aspects of the data storage device 102 may be implemented using a microprocessor or microcontroller programmed (e.g., by executing instructions) to perform one or more operations described herein, such as one or more operations of the methods 600-800. In a particular embodiment, the data storage device 102 includes a processor executing instructions (e.g., firmware) retrieved from the memory device 103. Alternatively or in addition, instructions that are executed by the processor may be retrieved from memory separate from the memory device 103, such as at a read-only memory (ROM) that is external to the memory device 103.

It should be appreciated that one or more operations described herein as being performed by the controller 130 may be performed at the memory device 103. As an illustrative example, in-memory ECC operations (e.g., encoding operations and/or decoding operations) may be performed at the memory device 103 alternatively or in addition to performing such operations at the controller 130.

To further illustrate, the data storage device 102 may be configured to be coupled to the access device 170 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory device 103 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory device 103 may include another type of memory. In a particular embodiment, the data storage device 102 is indirectly coupled to an access device (e.g., the access device 170) via a network. For example, the data storage device 102 may be a network-attached storage (NAS) device or a component (e.g., a solid-state drive (SSD) component) of a data center storage system, an enterprise storage system, or a storage area network. The memory device 103 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where they direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
    a memory; and
    a controller coupled to the memory, the controller configured to:
        encode first data according to a first error correction coding (ECC) encoding scheme to generate a first codeword;
        encode second data according to the first ECC encoding scheme to generate a second codeword;
        generate first parity data by encoding at least a first portion of the first codeword and a first portion of the second codeword using a composite generator function that corresponds to a multiplication product of a first generator function and a second generator function that is distinct from the first generator function; and
        store the first codeword, the second codeword, a first portion of the first parity data, and a second portion of the first parity data in the memory.

2. The device of claim 1, wherein the composite generator function includes a second degree polynomial.

3. The device of claim 1, wherein the first generator function corresponds to a first degree polynomial that includes a first constant and wherein the second generator function corresponds to another first degree polynomial that includes a second constant.

4. The device of claim 1, wherein the controller is further configured to generate a first parity codeword that encodes the first portion of the first parity data and to generate a second parity codeword that encodes the second portion of the first parity data, and wherein the controller is configured to store the first parity codeword in a first sub-page of a page of the memory and to store the second parity codeword in a second sub-page of the page.

5. The device of claim 1, wherein the controller is further configured to:
    generate second parity data by encoding at least a second portion of the first codeword and a second portion of the second codeword using the composite generator function; and
    store a first portion of the second parity data and a second portion of the second parity data in the memory.

6. The device of claim 5, wherein the first portion of the first codeword, the first portion of the second codeword, the first portion of the first parity data, and the second portion of the first parity data correspond to a first stripe of a data structure that includes the first codeword, the second codeword, the first portion of the first parity data, and the second portion of the first parity data, and wherein the second portion of the first codeword, the second portion of the second codeword, the first portion of the second parity data, and the second portion of the second parity data correspond to a second stripe of the data structure.

7. The device of claim 1, wherein the memory comprises a flash memory.

8. A method comprising:
    encoding first data according to a first error correction coding (ECC) encoding scheme to generate a first codeword;
    encoding second data according to the first ECC encoding scheme to generate a second codeword;
    generating first parity data by encoding at least a first portion of the first codeword and a first portion of the second codeword using a composite generator function that corresponds to a multiplication product of a first generator function and a second generator function that is distinct from the first generator function;
    generating second parity data by encoding at least a second portion of the first codeword and a second portion of the second codeword using the composite generator function; and
    storing the first codeword, the second codeword, a first portion of the first parity data, a second portion of the first parity data, a first portion of the second parity data, and a second portion of the second parity data in a memory, wherein the first portion of the first codeword, the first portion of the second codeword, the first portion of the first parity data, and the second portion of the first parity data correspond to a first stripe of a data structure, wherein the data structure includes the first codeword, the second codeword, the first portion of the first parity data, and the second portion of the first parity data, and wherein the second portion of the first codeword, the second portion of the second codeword, the first portion of the second parity data, and the second portion of the second parity data correspond to a second stripe of the data structure.

9. The method of claim 8, wherein the first generator function corresponds to a first that includes a first constant and wherein the second generator function corresponds to another first degree polynomial that includes a second constant.

10. The method of claim 8, further comprising:
generating a first parity codeword that encodes the first portion of the first parity data; and
generating a second parity codeword that encodes the second portion of the first parity data, wherein the first parity codeword is stored in a first sub-page of a page of the memory and the second parity codeword is stored in a second sub-page of the page.

11. The method of claim 10, wherein the first portion of the second parity data is stored in the first sub-page and wherein the second portion of the second parity data is stored in the second sub-page.

12. A device comprising:
a memory; and
a controller coupled to the memory, the controller configured to:
read codewords of a data structure from the memory, the codewords including a first codeword, a second codeword, a first parity codeword, and a second parity codeword, the first parity codeword including parity data based on a composite generator function that corresponds to a multiplication product of a first generator function and a second generator function that is distinct from the first generator function; and
in response to a number of the codewords that are undecodable at an error correction coding (ECC) decoder according to a first correction scheme exceeding an erasure correction capability of a second correction scheme, decode a stripe codeword of the data structure according to a third correction scheme, the stripe codeword including at least a portion of the first codeword, a portion of the second codeword, a portion of the first parity codeword, and a portion of the second parity codeword.

13. The device of claim 12, wherein the second correction scheme corresponds to an erasure correction scheme, and wherein the third correction scheme corresponds to an error correction scheme.

14. The device of claim 12, wherein the controller is configured to decode the second codeword prior to decoding the stripe codeword.

15. The device of claim 12, wherein the controller is configured to decode the first parity codeword prior to decoding the stripe codeword.

16. The device of claim 15, wherein the controller is configured to decode the second parity codeword prior to decoding the stripe codeword.

17. The device of claim 12, wherein the controller is configured to, after decoding the stripe codeword, initiate a decode operation of a modified version of the first codeword according to the first correction scheme, the modified version of the first codeword including an error-corrected version of the portion of the first codeword.

18. A method comprising:
reading codewords of a data structure from a memory, the codewords including a first codeword, a second codeword, a first parity codeword, and a second parity codeword, the first parity codeword including parity data based on a composite generator function that corresponds to a multiplication product of a first generator function and a second generator function that is distinct from the first generator function; and
in response to a number of the codewords that are undecodable at an error correction coding (ECC) decoder according to a first correction scheme exceeding an erasure correction capability of a second correction scheme, decoding a stripe codeword of the data structure according to a third correction scheme, the stripe codeword including at least a portion of the first codeword, a portion of the second codeword, a portion of the first parity codeword, and a portion of the second parity codeword.

19. The method of claim 18, wherein the second correction scheme corresponds to an erasure correction scheme, and wherein the third correction scheme corresponds to an error correction scheme.

20. The method of claim 18, further comprising decoding the second codeword prior to decoding the stripe codeword.

21. The method of claim 18, further comprising decoding the first parity codeword prior to decoding the stripe codeword.

22. The method of claim 21, further comprising decoding the second parity codeword prior to decoding the stripe codeword.

23. The method of claim 18, further comprising, after decoding the stripe codeword, initiating a decode operation of a modified version of the first codeword according to the first correction scheme, the modified version of the first codeword including an error-corrected version of the portion of the first codeword.

* * * * *